United States Patent
Shen et al.

(10) Patent No.: US 7,425,477 B2
(45) Date of Patent: Sep. 16, 2008

(54) MANUFACTURING METHOD OF THIN FILM TRANSISTOR INCLUDING IMPLANTING IONS THROUGH POLYSILICON ISLAND AND INTO UNDERLYING BUFFER LAYER

(75) Inventors: Chia-Nan Shen, Taipei County (TW); Wen-Chun Yeh, Taoyuan County (TW); Chia-Chien Chen, Taipei (TW); Bing-Wei Wu, Taoyuan County (TW); Hung-Chi Liao, Taipei County (TW)

(73) Assignee: Chunghwa Picture Tubes, Ltd., Taipei (TW)

( * ) Notice: Subject to any disclaimer, the term of this patent is extended or adjusted under 35 U.S.C. 154(b) by 343 days.

(21) Appl. No.: 11/306,105

(22) Filed: Dec. 16, 2005

(65) Prior Publication Data

US 2007/0122949 A1    May 31, 2007

(30) Foreign Application Priority Data

Nov. 30, 2005    (TW) ............................... 94142025 A

(51) Int. Cl.
*H01L 21/84* (2006.01)
(52) U.S. Cl. ................. 438/154; 438/163; 438/164; 257/E21.7
(58) Field of Classification Search ........... 438/154; 257/E21.7
See application file for complete search history.

(56) References Cited

U.S. PATENT DOCUMENTS

| | | | | | |
|---|---|---|---|---|---|
| 4,217,153 | A | * | 8/1980 | Fukunaga et al. | 438/154 |
| 6,388,291 | B1 | * | 5/2002 | Zhang et al. | 257/350 |
| 6,902,961 | B2 | * | 6/2005 | Chang et al. | 438/149 |
| 7,192,815 | B2 | * | 3/2007 | Shen | 438/164 |
| 2002/0182833 | A1 | * | 12/2002 | Yang | 438/587 |
| 2003/0134459 | A1 | * | 7/2003 | Tanaka et al. | 438/151 |
| 2004/0229408 | A1 | | 11/2004 | Chang | 439/149 |

* cited by examiner

*Primary Examiner*—Stephen W Smoot
(74) *Attorney, Agent, or Firm*—Jianq Chyun IP Office

(57) ABSTRACT

A manufacturing method of a thin film transistor is provided. A buffer layer is formed on a substrate, and then a first and a second poly-silicon island are formed thereon. A gate-insulating layer is formed on the substrate, and a first and a second gate are formed thereon. A sacrificed layer is formed on the substrate and a photo-resist layer is formed thereon. The sacrificed layer above the first poly-silicon island is removed by using the photo-resist layer as a mask. A first ion implantation process is performed to form a first source/drain. The photo-resist layer is removed and a second ion implantation process is performed to form a second source/drain. At the same time, the second ion implantation process is used to implant ions into the buffer layer below the two sides of the second gate. A lightly-doped ion implantation process is performed after removing the sacrificed layer.

10 Claims, 9 Drawing Sheets

MANUFACTURING METHOD OF THIN FILM TRANSISTOR INCLUDING IMPLANTING IONS THROUGH POLYSILICON ISLAND AND INTO UNDERLYING BUFFER LAYER

CROSS-REFERENCE TO RELATED APPLICATION

This application claims the priority benefit of Taiwan application serial no. 94142025, filed on Nov. 30, 2005. All disclosure of the Taiwan application is incorporated herein by reference.

BACKGROUND OF THE INVENTION

1. Field of Invention

The present invention relates to a manufacturing method of a thin film transistor. More particularly, the present invention relates to a manufacturing method of a low temperature poly-silicon thin film transistor.

2. Description of Related Art

In the early years, the poly-silicon thin film transistor (poly-silicon TFT) is manufactured by executing the solid phase crystallization (SPC) manufacturing process, for its manufacturing temperature reaches as high as 1000° C. Therefore, the quartz substrate with higher melting point is employed. Besides, the cost of the quartz substrate is much higher than that of the glass substrate. Also, due to limitation of size of the substrate, only small-scaled substrates can be developed in the past. With constantly advancing of laser techniques, the excimer laser annealing (ELA) technique is applied in the manufacturing process of the poly-silicon TFT.

The ELA technique mainly utilizes a laser beam for providing lighting on the amorphous silicon layer (a-Si layer) and melting the amorphous silicon layer. Then, after the recrystallization process, the amorphous silicon layer transforms into the poly-silicon layer. Because the poly-silicon TFT is manufactured by using ELA manufacturing process which is executed under the temperature of 600° C., this kind of poly-silicon TFT is also referred as LTPS TFT (low temperature poly-silicon TFT).

FIGS. 1A to 1C schematically show the manufacturing method of LTPS TFT in the prior art. Referring to FIG. 1A, the manufacturing method of LTPS TFT in the prior art comprises the steps as follows. A buffer layer 120 is formed on the substrate 110 and then a first poly-silicon island 130a and a second poly-silicon island 130b are formed on the buffer layer 120. Next, a gate insulating layer 140 is formed on the first poly-silicon island 130a and the second poly-silicon island 130b, and a first gate 150a and a second gate 150b are formed on the gate insulating layer 140.

Referring to FIG. 1B, a photo-resist layer 210 is formed on the substrate 110 for covering the second poly-silicon island 130b and the second gate 150b. Later, a first ion implantation process S110 is performed to form a first source/drain 132a within the first poly-silicon island 130a, and the region between the first source/drain 132a is the first channel region 134a.

Referring to FIG. 1C, after the formation of the first source/drain 132a, the photo-resist layer 210 is removed. Then, a photo-resist layer 220 is formed on the substrate 110 for covering the first poly-silicon island 130a and the first gate 150a. A second ion implantation process S120 is performed later to form a second source/drain 132b within the second poly-silicon island 130b, and the region between the second source/drain 132b is the second channel region 134b. Following that, the photo-resist layer 220 is removed, and the manufacturing of LTPS TFT in the prior art is finished on the whole up to the present. It's worthy to note that, to form the first source/drain 132a and the second source/drain 132b, it's required that the photo-resist layer 210 and the photo-resist layer 220 to be formed respectively for the manufacturing of LTPS TFT in the prior art. That is, two photolithography processes are required for manufacturing of the first source/drain 132a and the second source/drain 132b. To reduce the amount of photolithography process required, another manufacturing method of LTPS TFT in the prior art was proposed.

FIGS. 2A to 2B schematically show another manufacturing method of LTPS TFT in the prior art. Referring to FIG. 2A, this manufacturing method of LTPS TFT comprises the steps as follows. First, similar to the manufacturing method described previously, a buffer layer 120, a first poly-silicon island 130a, a second poly-silicon island 130b, a gate insulating layer 140, a first gate 150a and a second gate 150b are sequentially formed on the substrate 110. Later, the first ion implantation process S110 is performed to form a first source/drain 132a within the first poly-silicon island 130a, and the region between the first source/drain 132a is the first channel region 134a. It's worthy to note that, the first ion implantation process S110 also implants boron ions into the second poly-silicon island 130.

Then, referring to FIG. 2B, a photo-resist layer 230 is formed on the substrate 110 for covering the first poly-silicon island 130a and the first gate 150a. Next, a second ion implantation process S130 is performed to form a second source/drain 132c within the second poly-silicon island 130b, and the region between the second source/drain 132c is the second channel region 134c. Following that, the photo-resist layer 230 is removed, and the manufacturing of LTPS TFT is completed on the whole up to the present. It's worthy to note that, though one photolithography process can be saved, the boron ion is still implanted into the second poly-silicon island 130b with usage of the first ion implantation process S110. That is, the boron ion previously implanted tends to influence the phosphorous ion implanted by the second ion implantation process S130. Additionally, the two manufacturing methods both cannot provide the lightly doped drain structure that is used for improving the leakage current effect.

SUMMARY OF THE INVENTION

In view of this, the object of the present invention is to provide a manufacturing method of a thin film transistor that is capable of reducing the amount of photolithography process required and of providing the thin film transistor with lightly doped drain structure.

Based on the above object or others, the present provides a manufacturing method of a thin film transistor. First, a buffer layer is formed on a substrate, and then a first poly-silicon island and a second poly-silicon island are formed on the buffer layer. A gate-insulating layer is formed on the substrate and it covers the first poly-silicon island and the second poly-silicon island. Also, a first gate is formed on the gate-insulating layer above the first poly-silicon island and a second gate is formed on the gate-insulating layer above the second poly-silicon island. Next, a sacrificed layer is formed on the substrate, covering the first gate and the second gate. A photo-resist layer is formed on the sacrificed layer above the second poly-silicon island, and the sacrificed layer above the first poly-silicon island is removed by using the photo-resist layer as a mask. Following that, a first ion implantation process is performed to form a first source/drain within the first poly-silicon island below two sides of the first gate, and the region between the first source/drain is a first channel region.

The photo-resist layer is removed and a second ion implantation process is performed to form a second source/drain within the second poly-silicon island below two sides of the second gate, and the region between the second source/drain is a second channel region. Also, at the same time, the second ion implantation process is used to implant ions into the sacrificed layer below the two sides of the second gate. A lightly-doped ion implantation process is performed later to form a lightly doped drain between the second source/drain and the second channel region after removing the sacrificed layer.

According one embodiment of the present invention, the material of the sacrificed layer can be silicon nitride.

According one embodiment of the present invention, the thickness of the sacrificed layer is 50 Å to 2000 Å.

According one embodiment of the present invention, the ion concentration implanted by the second ion implantation process can be 1E14 to 1E15 ions/cm$^2$.

According one embodiment of the present invention, the implanting energy of the second ion implantation process can be 10 to 200 keV.

According one embodiment of the present invention, the manufacturing method of a thin film transistor can further comprises forming a patterned dielectric layer which exposes one part of the first source/drain and one part of the second source/drain, after forming the lightly doped drain. A first source/drain conductive layer and a second source/drain conductive layer are formed on the patterned dielectric layer. Wherein, the first source/drain conductive layer is electrically connected with the first source/drain respectively, and the second source/drain conductive layer is electrically connected with the second source/drain respectively.

According one embodiment of the present invention, after forming the first gate and the second gate on the gate-insulating layer, the manufacturing method of thin film transistor can further comprise a step of partly etching the gate-insulating layer by using the first gate and the second gate as a mask so that the thickness of the gate-insulating layer below the first gate and the second gate is larger than the thickness of the rest of the gate-insulating layer.

According one embodiment of the present invention, after forming the first gate and the second gate on the gate-insulating layer, the manufacturing method of a thin film transistor can further comprise a step of etching the gate-insulating layer by using the first gate and the second gate as a mask for removing the portion of the gate-insulating layer which is not covered by the first gate and the second gate.

According one embodiment of the present invention, the manufacturing method of a thin film transistor can further comprise a step of performing a third ion implantation process to implant ions into the first poly-silicon island after formation of the gate-insulating layer and before formation of the first gate and the second gate.

According one embodiment of the present invention, the manufacturing method of a thin film transistor can further comprise a step of performing a fourth ion implantation process to implant ions into the second poly-silicon island after formation of the gate-insulating layer and before formation of the first gate and the second gate.

Based on the descriptions above, the present invention is to form a sacrificed layer and a photo-resist layer which cover the second gate before forming the first source/drain. After formation of the first source/drain, the photo-resist layer is removed and a second ion implantation process is performed to form a second source/drain within the second poly-silicon island. Hence, due to the sacrificed layer that covers the second gate, the depths of ion implanting for distinct regions differ. In other words, the ions are implanted into the buffer layer which is disposed inside the second poly-silicon island and below the first poly-silicon island by using the second ion implantation process. Since the first poly-silicon island does not cover the photo-resist layer, the influence of the ions implanted by the second ion implantation process on electronic properties of the first poly-silicon island can be reduced. Furthermore, the amount of photolithography process required for the present invention is fewer, compared with that of the prior art.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

The First Embodiment

Figure 1A:
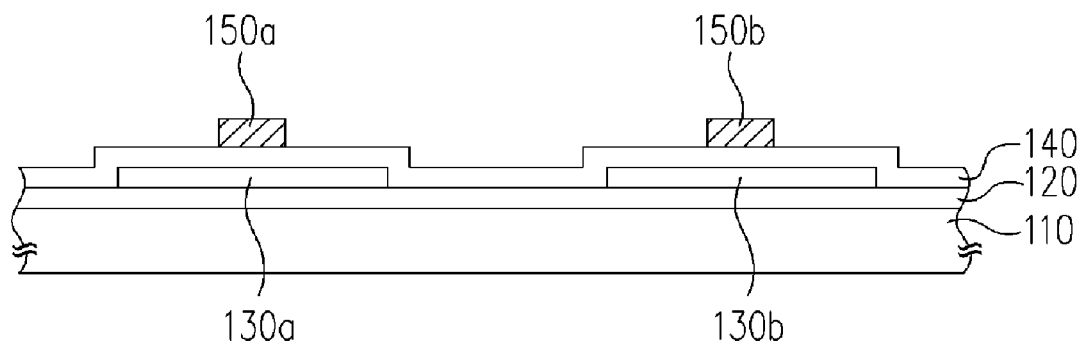
FIGS. 1A to 1C schematically show a manufacturing method of a low temperature poly-silicon thin film transistor in the prior art.
Figure 1B:
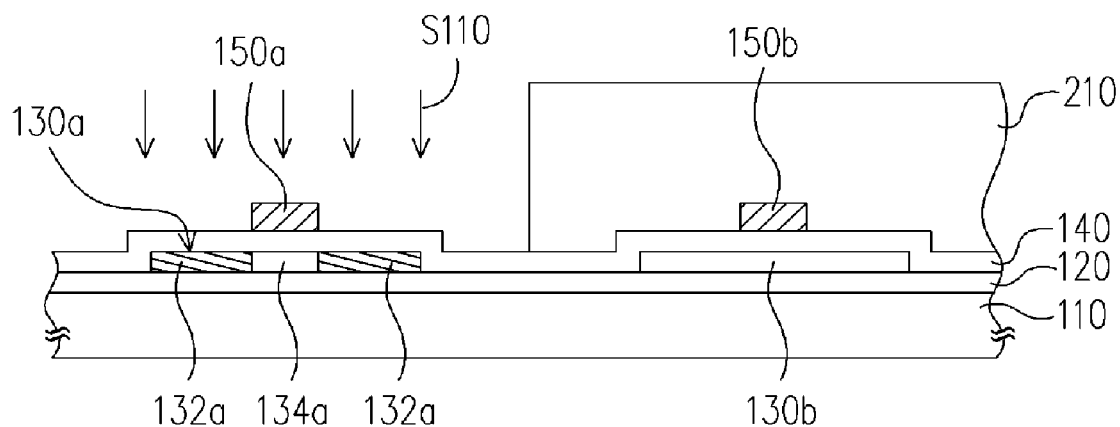
Figure 1C:
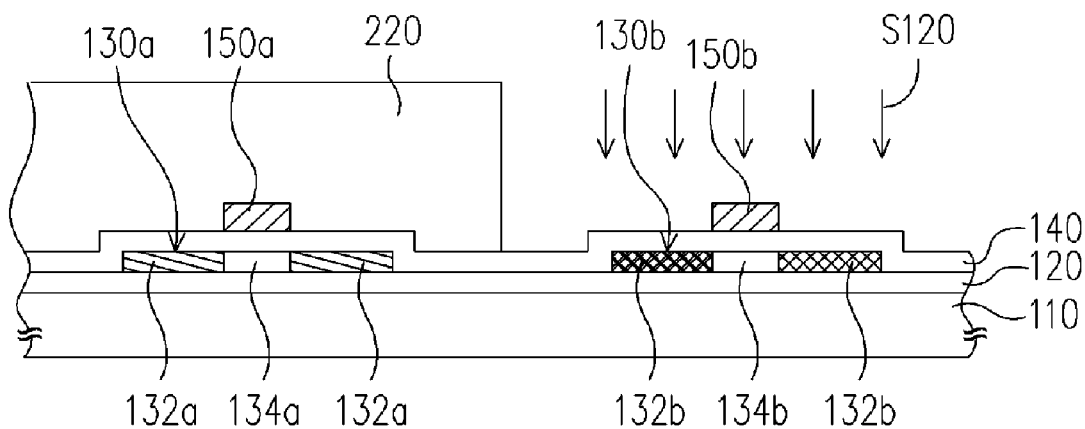
Figure 2A:
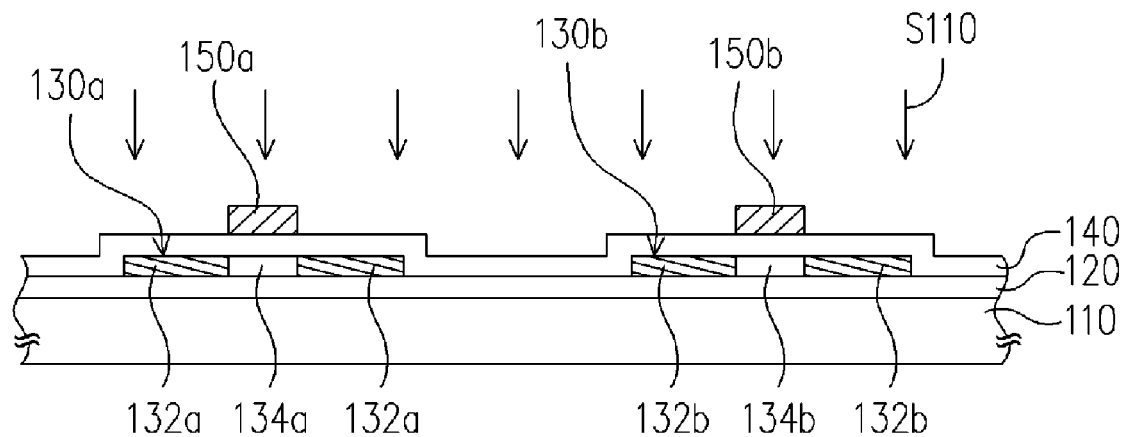
FIGS. 2A to 2B schematically show another manufacturing method of a low temperature poly-silicon thin film transistor in the prior art.
Figure 2B:
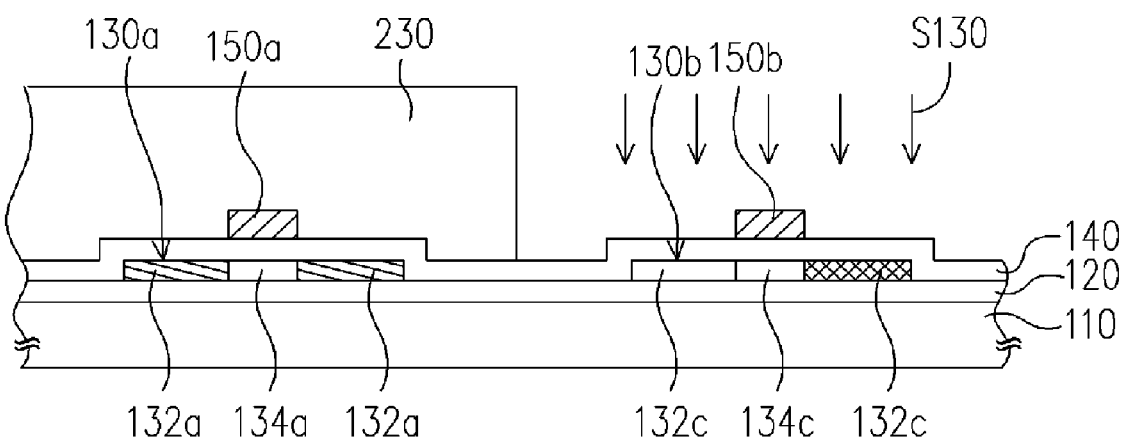
Figure 3A:
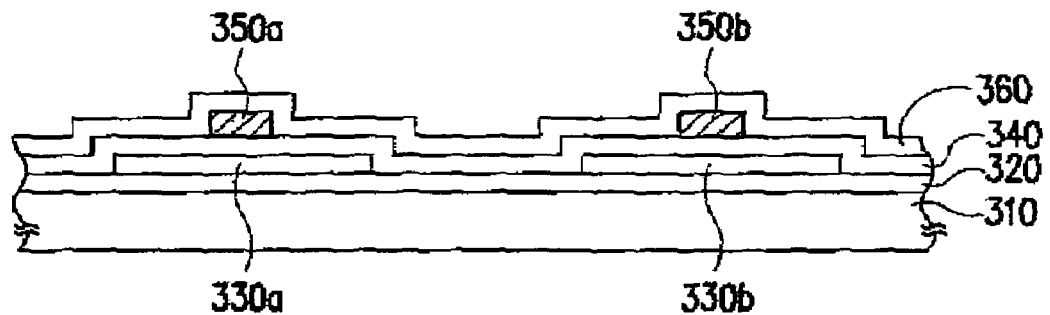
FIGS. 3A to 3E schematically show the manufacturing method of a TFT according to the first embodiment of the present invention.

FIGS. 3A to 3E schematically show the manufacturing method of a thin film transistor (TFT) according to the first embodiment of the present invention. Referring to FIG. 3A, the manufacturing method of a TFT of the present embodiment comprises the steps as follows. First, a buffer layer 320 is formed on a substrate 310, and the method of forming the buffer layer 320 can be low pressure chemical vapor deposition (LPCVD) technique or plasma enhanced chemical vapor deposition (PECVD) technique. In more detail, the buffer layer 320 may be single-layer silicon oxide or double-layer silicon oxide/silicon nitride, for example. Besides, the substrate 310 can be a glass substrate, a quartz substrate or a plastic substrate, for example.

Then, a first poly-silicon island 330a and a second poly-silicon island 330b are formed on the buffer layer 320. In more detail, the step of forming the first poly-silicon island 330a and the second poly-silicon island 330b, for example, is to form an amorphous silicon layer (not shown) on the substrate 310. The thickness of the amorphous silicon layer can be about 100 Å to 1000 Å and the preferable one is 500 Å. Additionally, the method of forming the amorphous silicon layer can be low pressure chemical vapor deposition (LPCVD) technique or plasma enhanced chemical vapor deposition (PECVD) technique. Later, a laser annealing process is preformed to transform the amorphous silicon layer into a poly-silicon layer. Then, photolithography and etching processes are performed with the poly-silicon layer so as to form the first poly-silicon island 330a and the second poly-silicon island 330b on the substrate 310.

The previously-mentioned laser annealing technique may be excimer laser annealing (ELA), solid-state laser or diode pumped solid-state laser (DPSS). Particularly, to reduce the hydrogen containment in the amorphous layer a dehydrogenation process can be performed before the laser annealing process with the amorphous layer is performed. It's worthy to note that the buffer layer 320 having a proper thickness can not only prevent metal ions inside the substrate 310 from diffusing over the first poly-silicon island 330a and the second poly-silicon island 330b to be formed later, but also reduce cooling speed of the laser annealing technique. Furthermore, said buffer layer 320 is also helpful in improving diffusing situation of metal ions over the poly-silicon island 330 inside the substrate 310.

Later, referring to FIG. 3A, a gate-insulating layer 340 is formed on the substrate 310 and it covers the first poly-silicon island 330a and the second poly-silicon island 330b. In addition, the material of the gate-insulating layer 340 can be silicon oxide or other insulating materials. In more detail, the method of forming silicon oxide can be the PECVD technique along with reacting gases such as $SiH_4/N_2O$ or TEOS/$O_2$, for example. It's noted that, in order to regulate electronic characteristics of the first poly-silicon island 330a and the second poly-silicon island 330b, the ion implantation process, i.e. the channel doping process, can be performed with the first poly-silicon island 330a and the second poly-silicon island 330b, respectively.

Following that, a first gate 350a is formed on the gate-insulating layer 340 which is above the first poly-silicon island 330a, and a second gate 350b is formed on the gate-insulating layer 340 which is above the second poly-silicon island 330b. In more detail, the method of forming the first gate 350a and the second gate 350b, for example, is to form a gate material layer (not shown) on the gate-insulating layer 340 by using the sputtering technique and physical vapor deposition (PVD) technique. Here, the material of the gate material layer can be Cr or other metal materials, and the thickness of the gate material layer can be about 1000 Å and 8000 Å and the preferred one is 4000 Å. And then, the first gate 350a and the second gate 350b are formed by performing the photolithography and the etching processes with this gate material layer.

After forming the first gate 350a and the second gate 350b, a sacrificed layer 360 is formed on the substrate 310 and it covers the first gate 350a, second gate 350b and the gate-insulating layer 340, and wherein, the thickness of the sacrificed layer 360 can be 50 Å to 2000 Å and the preferable one is 1000 Å. Additionally, the material of the sacrificed layer 360, for example, is silicon nitride and the method of forming silicon nitride can be PECVD technique together with reacting gas of $SiH_4/NH_3$, for example.

Figure 3B:
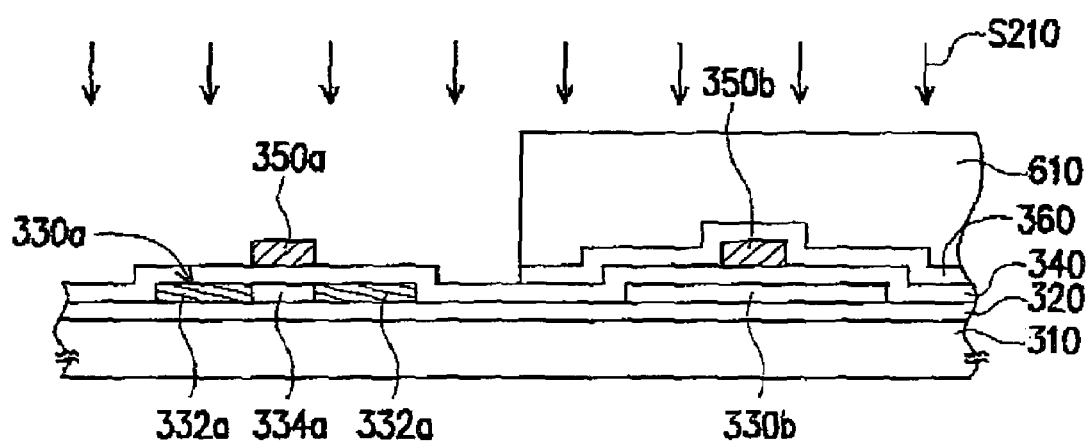

Referring to FIG. 3B, a photo-resist layer 610 is formed on the sacrificed layer 360 above the second poly-silicon island 350b, and then the sacrificed layer 360 above the first poly-silicon island 350a is removed by using the photo-resist layer 610 as a mask. The method of removing the sacrificed layer 360, for example, is to perform the etching process with phosphoric acid in the case that material of the sacrificed layer 360 is silicon nitride. After that, a first ion implantation process S210 is performed to form a first source/drain 332a within the first poly-silicon island 330a below two sides of the first gate 350a, and the region between the first source/drain 332a is a first channel region 334a accordingly.

Besides, the ions implanted by the first ion implantation process S210 may be p-type dopant and the p-type dopant can be boron ions for example. Furthermore, doping concentration of boron ions can be 2E14 to 2E15 ions/cm$^2$ and the preferable one is 1E15 ions/cm$^2$. In addition, the preferable implanting energy is 30 KeV, for example.

Figure 3C:
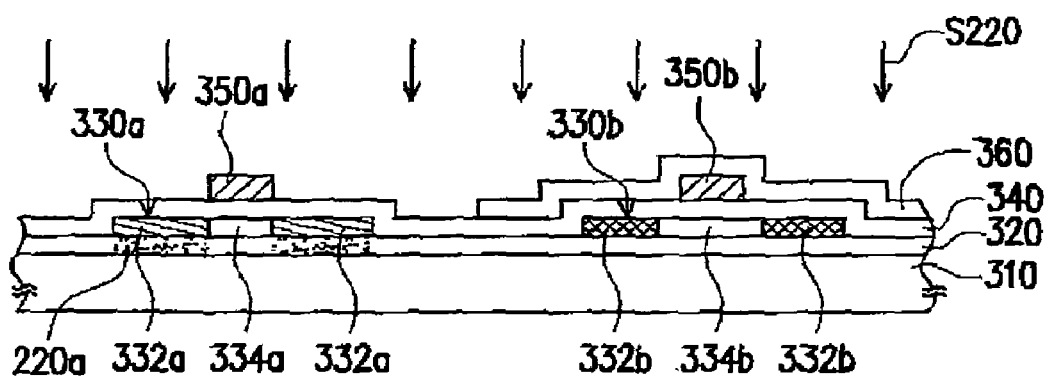

The photo-resist layer 610 is removed after the first source/drain 332a is formed, referring to FIG. 3C. Next, a second ion implantation process S220 is performed to form a second source/drain 332b within the second poly-silicon island 330b below two sides of the second gate 350b, and the region between the second source/drain 332a is a second channel region 334b accordingly. Additionally, the ions implanted by the second ion implantation process S220 may be n-type dopant and the n-type dopant can be phosphorus ions for example. Further, doping concentration of phosuhorus ions can be 1E14 to 1E15 ions/cm$^2$ and the preferable one is 5E14 ions/cm$^2$. The preferable doing energy is 125 KeV, for example.

It's worthy to note that, due to providing of the sacrificed layer 360, the ions can not only be implanted into the second poly-silicon island 330b but further into the buffer layer 320 through the first poly-silicon island 330a by the second ion implantation process S220, and thus ions 220a are also implanted into the buffer layer 320. In other words, regarding the first poly-silicon island 330a, the ions implanted by the first ion implantation process S210 and the ions implanted by the second poly-silicon island 330b does not interfere with each other. That is, with usage of the sacrificed layer 360 the doping depths for distinct regions are not identical. Furthermore, the sacrificed layer 360 is also served as a mask and thus the edges of the second source/drain 332b which are formed by the second ion implantation process S220 are not aligned with the edges of the second gate 350b.

Figure 3D:
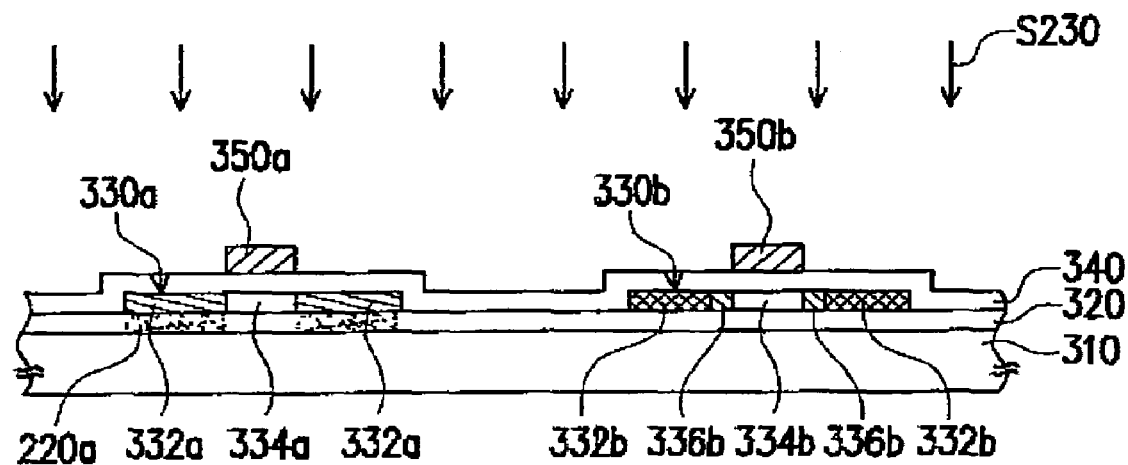

Referring to FIG. 3D, after removing the sacrificed Layer 360, a lightly-doped ion implantation process S230 using the second gate 350b as a mask is performed to form a lightly doped drain 336b between the second source/drain 332b and the channel region 334b, for improving the hot carrier effect. Up to the present the manufacturing of a TFT is initially completed. Besides, the ions implanted by the lightly-doped ion implantation process S230 may be n-type dopant and the n-type dopant can be boron phosphorus ions further, doping concentration of phosuhoms ions can be about 1E13 to 1E14 ions/cm$^2$ and the preferable one is 5E13 ions/cm$^2$, for example. The implanting energy for example is about 10 keV to 100 keV and the preferable one is 65 keV.

Referring to FIG. 3D, after removing the sacrificed layer 360, a lightly-doped ion implantation process S230 using the second gate 350b as a mask is performed to form a lightly doped drain 336b between the second source/drain 332b and the channel region 334b, for improving the hot carrier effect. Up to the present, the manufacturing of a TFT is initially completed. Besides, the ions implanted by the lightly-doped ion implantation process S230 may be n-type dopant and the n-type dopant can be boron ions. Further, doping concentration of boron ions can be about 1E13 to 1E14 ions/cm$^2$ and the preferable one is 5E13 ions/cm$^2$, for example. The implanting energy for example is about 10 keV to 100 keV and the preferable one is 65 keV.

Compared with the manufacturing method of a TFT in the prior art, the present invention utilizes the sacrificed layer 360 and the second gate 350b which is used as a mask to form the second source/drain 332b, and later with removing of the sacrificed layer 360, the second gate 350b can be directly used as a mask for forming the lightly doped drain 336b. Therefore, no additional photolithography process is required for defining the lightly doped drain 336b according to the present invention.

Figure 3E:
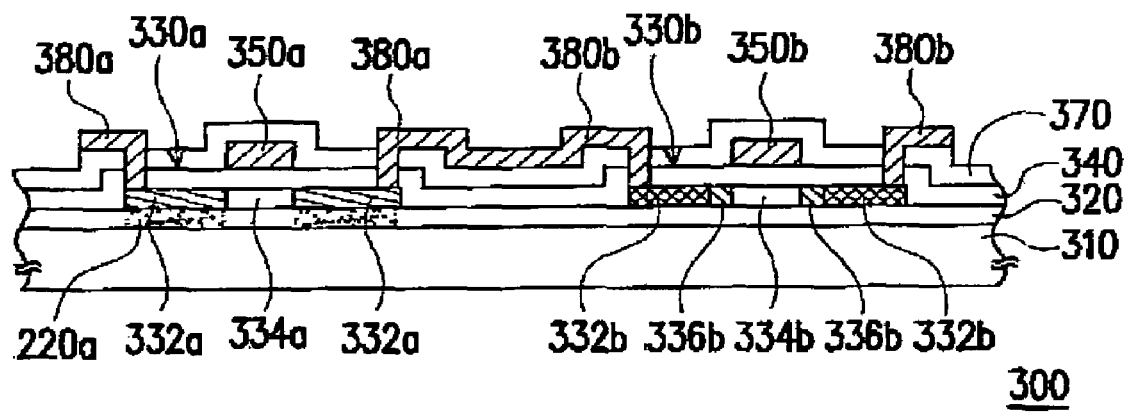

Referring to FIG. 3E, after forming the lightly doped drain 336b, a patterned dielectric layer 370 is formed on the substrate 310 and it exposes a portion of the first source/drain 332a and a portion of the second source/drain 332b. In more detail, the method of forming the patterned dielectric layer 370 is to form a dielectric layer on the substrate 310 first by using the CVD process and the material of this dielectric layer can be silicon oxide, silicon nitride or other insulating materials. The thickness of the dielectric layer can be about 2000 Å to 8000 Å and the preferable one is 4000 Å. After formation of the dielectric layer, a thermal process for the structure body formed by the processes described above is performed. The thermal process can be a rapid thermal annealing (RTA) process with temperature ranging between 500° C. to 650° C. and the preferable temperature is 600° C. Moreover, annealing time can be 10 to 120 seconds and the preferable one is 70 seconds. After that, a lithography process and an etching process are performed with this dielectric layer for defining the patterned dielectric layer 370.

Then, a first source/drain conductive layer 380a and a second source/drain conductive layer 380b are formed on the patterned dielectric layer 370, and manufacturing of a TFT 300 is completed. The first source/drain conductive layer 380a is electrically connected with the first source/drain 332a respectively, and second source/drain conductive layer 380b is electrically connected with the second source/drain 332b respectively. In more detail, the method of forming the first source/drain conductive layer 380a and the second source/drain conductive layer 380b, for example, is to form a source/drain conductive material layer on the patterned dielectric layer 370 in advance by using the sputtering process or physical vapor deposition (PVD) process. Wherein, the material of the source/drain conductive material layer can be Cr or other metal materials. In addition, the thickness of the source/drain conductive material layer can be about 1000 Å to 8000 Å and the preferable thickness is 4000 Å. Later, a photolithography process and an etching process are performed with the source/drain conductive material layer to form the first source/drain conductive layer 380a and the second source/drain conductive layer 380b.

The Second Embodiment

Figure 4A:
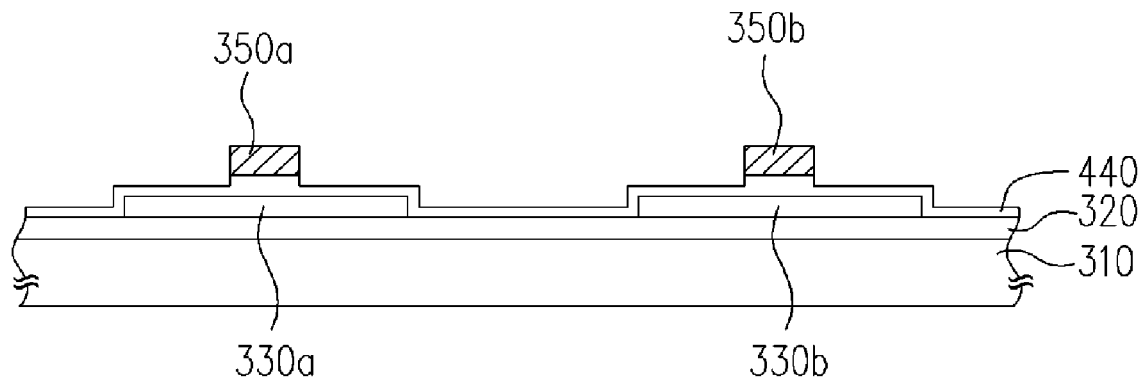
FIGS. 4A to 4F schematically show the manufacturing method of a TFT according to the second embodiment of the present invention.
Figure 4B:
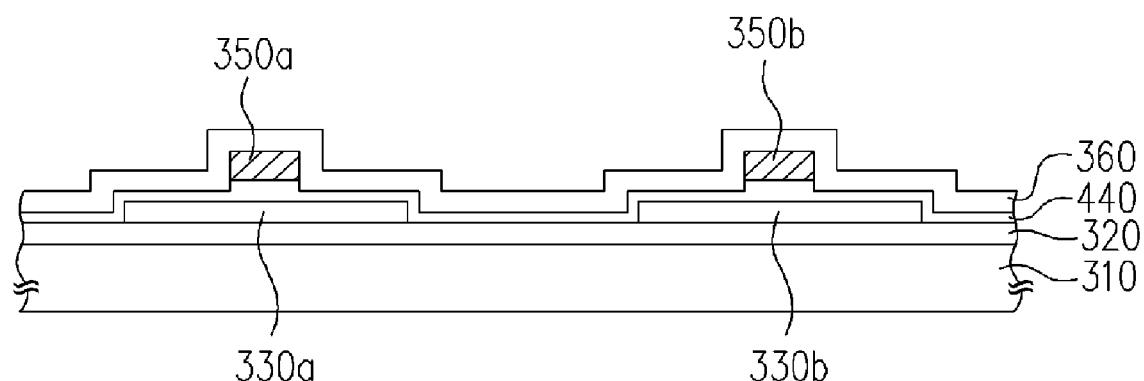
Figure 4C:
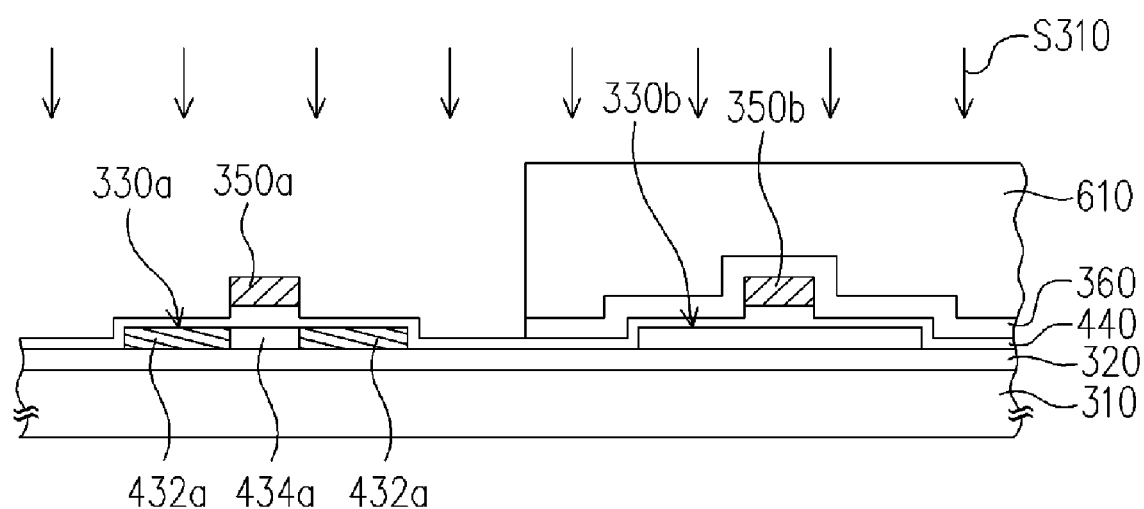
Figure 4D:
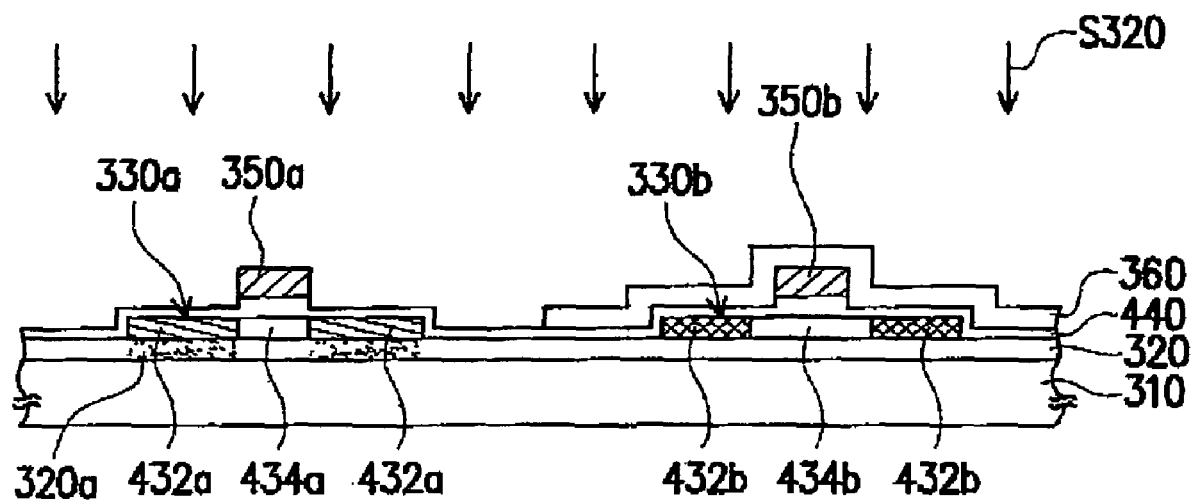
Figure 4E:
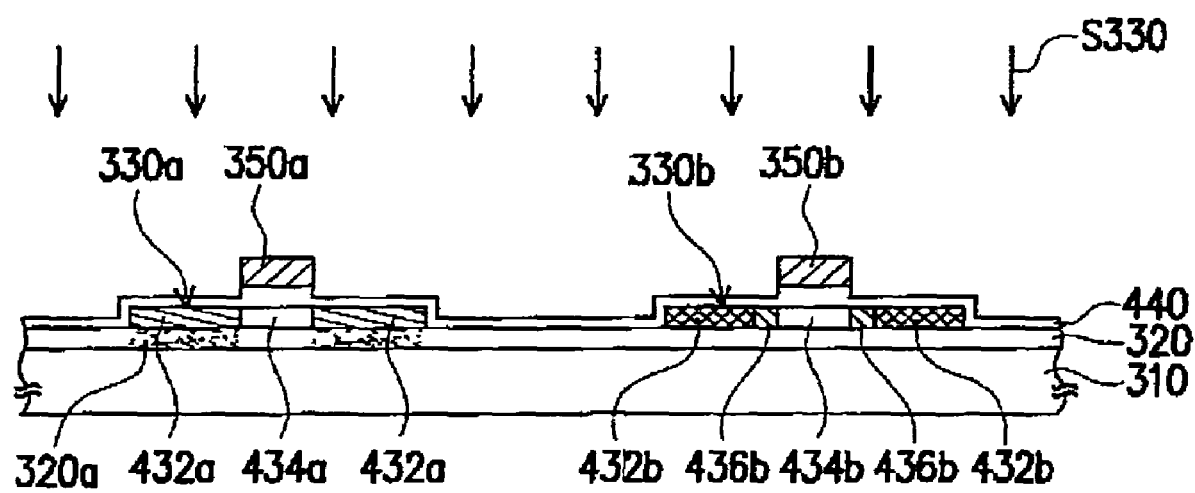
Figure 4F:
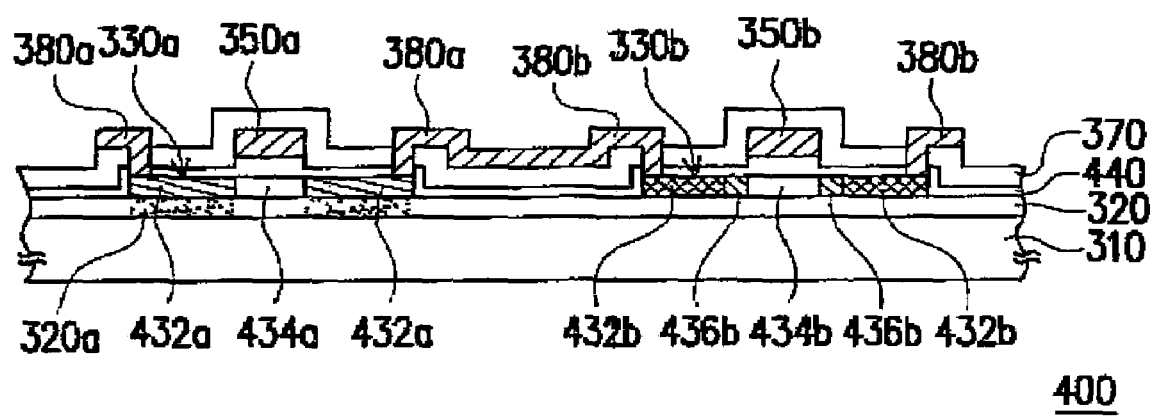

FIGS. 4A to 4F schematically show the manufacturing method of a TFT according to the second preferred embodiment of the present invention. Referring to FIG. 4A, it can be seen that the second embodiment is similar to the first embodiment and the difference between them is as follows. After sequentially forming the buffer layer 320, the first poly-silicon island 330a, the second poly-silicon island 330b, the gate-insulating layer 440, the first gate 350a and the second gate 350b, the gate-insulating layer 440 is partly etched by using the first gate 350a and the second gate 350b as a mask such that thickness of the gate-insulating layer 440 below the first gate 350a and the second gate 350b is larger than that of other portion of the gate-insulating layer 440. In more detail, the preferred thickness of the gate-insulating layer 440 is 400 Å after etching.

The steps in FIGS. 4B to 4F, similar to those in FIGS. 3A to 3E, comprises: forming the sacrificed layer 360; forming the photo-resist layer 610; removing a portion of the sacrificed layer 360; forming the first source/drain 432a and the first channel region 434a between the first source/drain 432a; forming the second source/drain 432b and the second channel region 434b between the second source/drain 432b; forming the lightly doped drain 436b between the second source/drain 432b and the second channel region 434b; forming the patterned dielectric layer 370, forming a first source/drain conductive layer 380a and a second source/drain conductive layer 380b; and so on. The manufacturing of a TFT 400 is completed accordingly.

Compared with the first embodiment, due to thinner thickness of the gate-insulating layer 440, implanting energy of the first ion implantation process S310 can be about 5 keV to 100 keV and preferred one is 250 keV. Besides, the preferred implanting energy of the second ion implantation process S320 is 80 keV. Furthermore, implanting energy of the lightly-doped ion implantation process S330 can be about 5 keV to 100 keV and preferred implanting energy is 40 keV.

It's worthy to note that, resembling the first embodiment, due to the sacrificed layer 360 that covers the second poly-silicon island 330b the ions can be implanted into the buffer layer 329 below the first poly-silicon island 330a through the first poly-silicon island 330a during the second ion implantation process S320, and thus ions 320a are also implanted into the buffer layer 320. In other words, the influence of the ions implanted by the second ion implantation process on electronic properties of the first poly-silicon island can be reduced. In addition, as the implanting energy used by the second ion implantation process S320 is relatively lower, the damaging caused by the second ion implantation process S320 on the crystal lattice structure of the first poly-silicon island 330a is minor.

The Third Embodiment

Figure 5A:
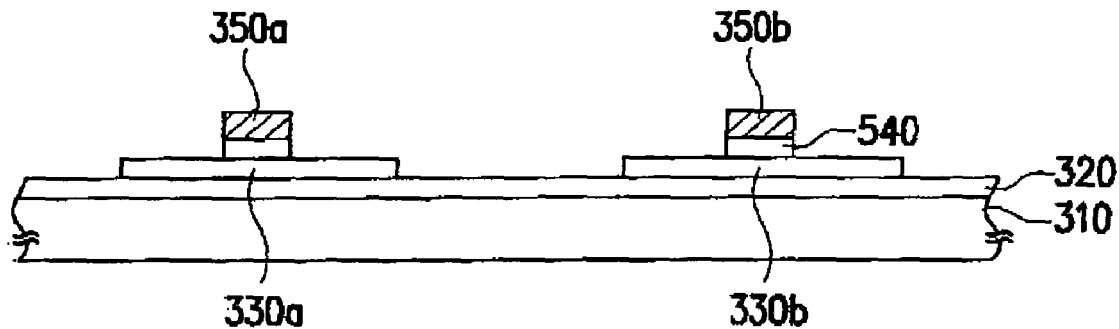
FIGS. 5A to 5E schematically show the manufacturing method of a TFT according to the third embodiment of the present invention.
Figure 5B:
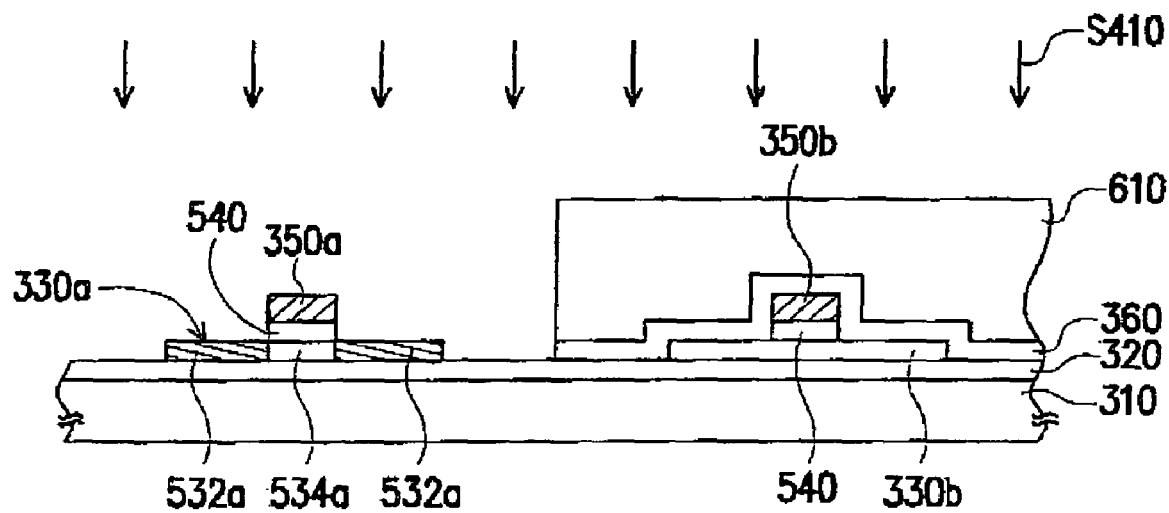
Figure 5C:
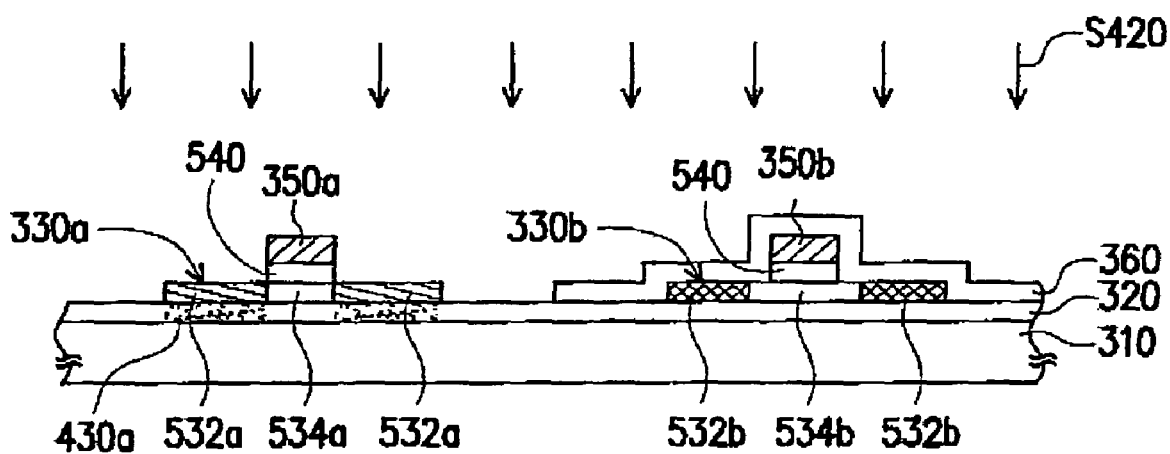
Figure 5D:
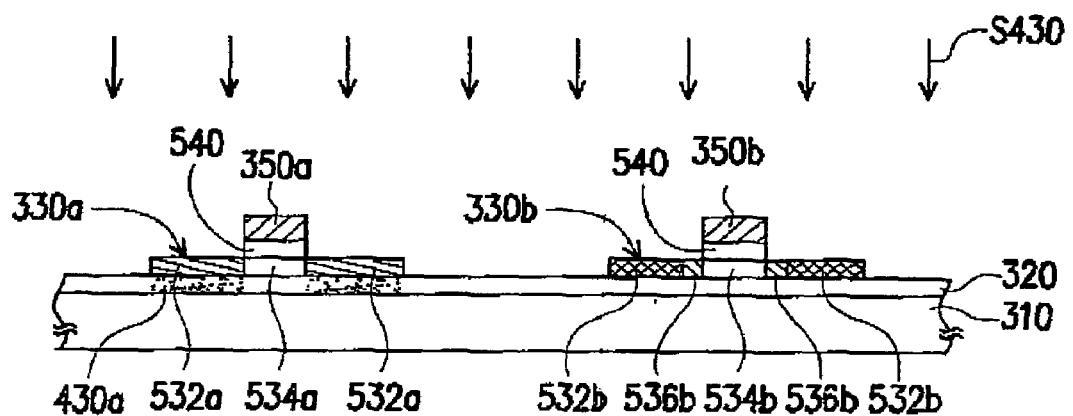
Figure 5E:
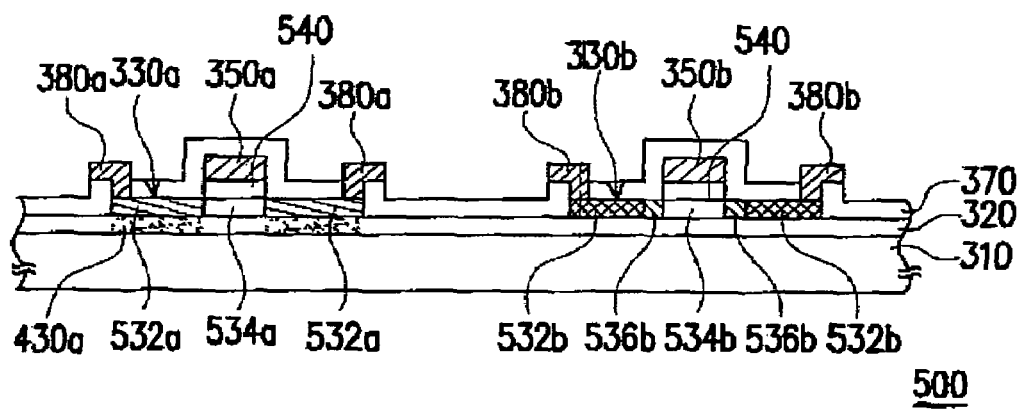

FIGS. 5A to 5E schematically show the manufacturing method of a TFT according to the third preferred embodiment of the present invention. Referring to FIG. 5A, it can be seen that the third embodiment is similar to the first embodiment and the difference between them is as follows. After sequentially forming the buffer layer 320, the first poly-silicon island 330a, the second poly-silicon island 330b, the gate-insulating layer 540, the first gate 350a and the second gate 350b, the part of gate-insulating layer 540 which is not covered by the first gate 350a and the second gate 350b is entirely etched by using the first gate 350a and the second gate 350b as a mask.

The steps in FIGS. 5B to 5E, similar to those in FIGS. 3B to 3E as well, comprises: forming the sacrificed layer 360; forming the photo-resist layer 610; removing a portion of the sacrificed layer 360; forming the first source/drain 532a and the first channel region 534a between the first source/drain 532a; forming the second source/drain 532b and the second channel region 534b between the second source/drain 532b; forming a lightly doped drain 536b between the second source/drain 532b and the second channel region 534b; forming the patterned dielectric layer 370, forming a first source/drain conductive layer 380a and a second source/drain conductive layer 380b; and so on. The manufacturing of a TFT 500 is completed accordingly.

Particularly, compared with the second embodiment, because the part of gate-insulating layer 540 which is not covered by the first gate 350a and the second gate 350b is entirely removed, implanting energy of the first ion implantation process S410 can be about 5 keV to 100 key and the preferred one is 10 keV. Besides, implanting energy of the second ion implantation process S420 can be about 10 kev to 200 keV and the preferred one is 65 keV, and the second ion implantation process S420 also implant ions 430a into the buffer layer 320. Furthermore, the implanting energy of the lightly-doped ion implantation process S430 can be about 5 keV to 100 keV and the preferred one is 10 keV.

To sum up, compared with the prior art, the present invention is to form a sacrificed layer on the second gate before performing the first and second ion implantation processes, and the ions can be implanted into the buffer layer below the first poly-silicon island through the first poly-silicon island during the second ion implantation process. Therefore, the influence of the ions implanted by the second ion implantation process on the ions implanted into the first poly-silicon island by the first ion implantation process can be reduced. In other words, based on the present invention, one photolithography process can be saved and mutual interference between boron ions and lightly doped phosphorous ions can be improved, in contrast to the prior art.

Additionally, the sacrificed layer formed according to the present invention can still be served as the mask of the lightly doped drain, and therefore no need of photolithography process for forming the lightly doped drain is required.

Moreover, under limitation of implanting energy for the ion implantation apparatuses, the present invention provides a distinct manufacturing method that is not only suitably used in ion implantation apparatuses with lower implanting energy but capable of further improving the damage that is caused by ion implantation processes on the crystal lattice structure of the poly-silicon island.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A manufacturing method of a thin film transistor, comprising:
   forming a buffer layer on a substrate;
   forming a first poly-silicon island and a second poly-silicon island on the buffer layer;
   forming a gate-insulating layer on the substrate, the gate-insulating layer covering the first poly-silicon island and the second poly-silicon island;
   forming a first gate on the gate-insulating layer which is above the first poly-silicon island and a second gate on the gate-insulating layer which is above the second poly-silicon island;
   forming a sacrificed layer on the substrate, the sacrificed layer covering the first gate and the second gate;
   forming a photo-resist layer on the sacrificed layer which is above the second poly-silicon island;
   removing the sacrificed layer which is above the first poly-silicon island by using the photo-resist layer as a mask;
   performing a first ion implantation process for forming a first source/drain within the first poly-silicon island below two sides of the first gate, and wherein, a first channel region is formed between the first source/drain;
   performing a second ion implantation process for forming a second source/drain within the second poly-silicon island below two sides of the second gate, and wherein, a second channel region is formed between the second source/drain, and simultaneously, the second ion implantation process is performed to implant ions into the buffer layer below two sides of the first gate;
   removing the sacrificed layer; and
   performing a lightly-doped ion implantation process for forming a lightly doped drain between the second source/drain and the second channel region.

2. The manufacturing method of a thin film transistor according to claim 1, wherein the material of the sacrificed layer includes silicon nitride.

3. The manufacturing method of a thin film transistor according to claim 1, wherein the thickness of the sacrificed layer is 50 Å to 2000 Å.

4. The manufacturing method of a thin film transistor according to claim 1, wherein the ion concentration implanted by the sewnd ion implantation process is 1E14 to 1E15 ions/cm$^2$.

5. The manufacturing method of a thin film transistor according to claim 1, wherein the implanting energy implanted by the second ion implantation process is 10 keV to 200 keV.

6. The manufacturing method of a thin film transistor according to claim 1, wherein after forming the lightly doped drain, further comprising:
   forming a patterned dielectric layer on the substrate, and wherein the patterned dielectric layer exposes a portion of the first source/drain and a portion of the second source/drain; and
   forming a first source/drain conductive layer and a second source/drain conductive layer on the patterned dielectric layer, and wherein, the first source/drain conductive layer is electrically connected with the first source/drain respectively and the second source/drain conductive layer is electrically connected with the second source/drain respectively.

7. The manufacturing method off a thin film transistor according to claim 1, wherein after forming the first gate and the second gate on the gate-insulating layer, further comprising partly etching the gate-insulating layer by using the first gate and the second gate as a mask so that the thickness of the gate-insulating layer below the first gate and the second gate is larger than the thickness of the rest of the gate-insulating layer.

8. The manufteturing method of a thin film transistor according to claim 1, wherein after forming the first gate and the second gate on the gate-insulating layer, further comprises etching the gate-insulating layer by using the first gate and the second gate as a mask for removing a portion of the gate-insulating layer which is not covered by the first gate and the second gate.

9. The manufacturing method of a thin film transistor according to claim 1, further comprising performing a third ion implantation process to implant ions into the first poly-silicon island after formation of the gate-insulating layer and before formation of the first gate and the second gate.

10. The manufacturing method of a thin film transistor according to claim 1, further cpmprising performing a fourth ion implantation process to implant ions into the second poly-silicon island after formation of the gate-insulating layer and before formation of the first gate and the second gate.

* * * * *